(12) United States Patent
Adeniji et al.

(10) Patent No.: US 9,471,730 B2
(45) Date of Patent: Oct. 18, 2016

(54) GENERALIZED INFLOW PERFORMANCE MODEL FOR OIL WELLS OF ANY INCLINED ANGLE AND A COMPUTER-IMPLEMENTED METHOD THEREOF

(71) Applicant: King Fahd University of Petroleum and Minerals, Dhahran (SA)

(72) Inventors: Adewale Wasiu Adeniji, Dhahran (SA); Sami Abdulaziz Alnuaim, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 316 days.

(21) Appl. No.: 14/177,544

(22) Filed: Feb. 11, 2014

(65) Prior Publication Data

US 2015/0227648 A1   Aug. 13, 2015

(51) Int. Cl.
 G06F 17/10      (2006.01)
 G06F 17/50      (2006.01)
 E21B 41/00      (2006.01)

(52) U.S. Cl.
 CPC ........... *G06F 17/5009* (2013.01); *E21B 41/00* (2013.01)

(58) Field of Classification Search
 CPC ....................... E21B 41/00; G06F 17/5009
 See application file for complete search history.

(56) References Cited

U.S. PATENT DOCUMENTS

| | | | |
|---|---|---|---|
| 5,871,047 A | 2/1999 | Spath et al. | |
| 7,172,020 B2 | 2/2007 | Tseytlin | |
| 8,463,585 B2 | 6/2013 | Sun et al. | |
| 2005/0114105 A1* | 5/2005 | Barber | G05B 17/02 703/2 |
| 2013/0346033 A1* | 12/2013 | Wang | G06F 17/18 703/2 |

OTHER PUBLICATIONS

A.M. Cheng, "Inflow performance relationships for solution-gas-drive slanted/horizontal wells,"1990, paper SPE 20720, Society of Petroleum Engineers, pp. 77-83.*
J.M. Richardson et al., "Two-rate IPR testing-a practical production tool," 1982, Journal of Canadian Petroleum Technology, vol. 21, issue 2, pp. 57-60.*
Tarek H. Ahmed, "Reservoir Engineering Handbook," 2010, Elsevier, pp. 484-545.*
K.A. Fattah et al., "New inflow performance relationship for solution-gas drive oil reservoirs," 2012, Oil and Gas Business, No. 5, pp. 343-366.*

(Continued)

*Primary Examiner* — Aniss Chad
*Assistant Examiner* — Russ Guill
(74) *Attorney, Agent, or Firm* — Oblon, McClelland, Maier & Neustadt, L.L.P.

(57) ABSTRACT

An improved inflow performance model that provides the performance of oil wells having any slant angle within the entire azimuth of 0-90 degrees, in saturated and under saturated reservoirs. A generalized model is formulated by normalizing the coefficients of inflow performance relationship (IPR) model by performing a linear regression analysis. The generalized model is further modified to account for skin factor and is also integrated with a straight line IPR to be suitable for determining the performance of under saturated oil wells. For the case of flowing bottom-hole pressures above bubble point pressure, the straight line IPR model is used to determine the flow rate of the oil well, whereas for the case of having bottom-hole pressure below the bubble point pressure, the generalized IPR model is used to determine the flow rate performance of the well.

18 Claims, 8 Drawing Sheets

(56) References Cited

OTHER PUBLICATIONS

Fang Yao et al., "Functional quadratic regression," 2010, Biometrika, vol. 97, No. 1, pp. 49-64.*

M.B. Standing, "Inflow performance relationships for damaged wells producing by solution-gas drive," Nov. 1970, Journal of Petroleum Technology, pp. 1399-1400.*

Muhammad Yousef Jabbar et al., "Analytical comparison of empirical two phase IPR correlations for horizontal oil wells," Mar. 10, 2013, SPE 164143, Society of Petroleum Engineers, pp. 1-12.*

"Inflow Performance Relationship of Vertical & Slanted Solution Gas-Drive Wells," Sep. 2012, http://excelcalculations.blogspot.com/2012/09/inflow-performance-relationship-of.html, pp. 1-3.*

Trevor Hastie et al., "Varying-coefficient models," 1993, Journal of the Royal Statistical Society B, vol. 55, No. 4, pp. 757-796.*

* cited by examiner

GENERALIZED INFLOW PERFORMANCE MODEL FOR OIL WELLS OF ANY INCLINED ANGLE AND A COMPUTER-IMPLEMENTED METHOD THEREOF

BACKGROUND

1. Field of Disclosure

Embodiments described herein generally relate to an improved inflow performance relationship model for oil reservoirs and a computer-implemented method for estimating the inflow performance. Specifically, a generalized model and computer-implemented method is provided that predicts the performance of oil wells having a slant angle within the entire azimuth of zero degrees to ninety degrees for both saturated and under saturated reservoirs.

2. Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Several studies have been conducted that aim to predict the performance of oil wells in order to determine an optimum production strategy to maximize recovery from the reservoirs. Due to the enormous productivity of slanted/horizontal oil wells as compared to conventional vertical wells, it is important that the performance of slanted oil wells be accurately estimated in order to aid decision making such as increasing or decreasing the production rate of the well, whether to stimulate or fracture the well and the like.

Various models have been developed to estimate productivity of vertical and horizontal wells, but the productivity of horizontal wells has been the subject of most recent investigations. Generally the inflow performance relationship (IPR) is a mathematical tool used to assess well performance by plotting the well production rate against the flowing bottom hole pressure (BHP). The data required to create the IPR are obtained by measuring the production rates under various drawdown pressures. The reservoir fluid composition and behavior of the fluid phases under flowing conditions determine the shape of the curve. A model described by Vogel, "Inflow Performance Relationships for Solution-Gas Drive Wells," JPT (January, 1968), pp. 83-92, incorporated by reference herein, is a fundamental model for vertical wells. Vogel's IPR is formulated as:

$$\frac{q_o}{q_{o,max}} = 1.0 - 0.2\left(\frac{P'_{wf}}{P_r}\right) - 0.8\left(\frac{P'_{wf}}{P_r}\right)^2$$

Wherein $q_o$ is the oil flow rate, $P_r$ is the average reservoir pressure and $P'_{wf}$ is the bottom-hole flowing pressure.

The work conducted by Standing, "Inflow Performance Relationships for Damaged Wells Producing by Solution-Gas Drive," JPT, November 1970, pp. 1399-1400, incorporated herein by reference, modified Vogel's IPR to account for formation damage or stimulation by including the effect of skin factor through the concept of Flow Efficiency (FE). Further Standing extended the application of Vogel's IPR to predict future IPR of a well as a function of reservoir pressure. The IPR for non-zero skin factor is given as:

$$\frac{q_o}{q_{o,max}^{FE=1}} = 1.8FE\left(1 - \left(\frac{P_{wf}}{P_r}\right)\right) - 0.8FE^2\left(1 - \left(\frac{P_{wf}}{P_r}\right)\right)^2$$

Wherein $P_{wf}$ is the bottom-hole pressure with a non-zero skin factor.

Fetkovich, "The Isochronal Testing of Oil Wells," Paper SPE 4529, presented at the 48th Annual Fall Meeting, Las Vegas, Nev., Sep. 30-Oct. 3, 1973. (SPE Reprints Series No. 14, 265)", incorporated herein by reference, developed an IPR for under-saturated oil reservoirs using two scenarios: when the bottom-hole flowing pressure is above bubble-point pressure, a straight line IPR is used $q_o=J(P_r-P_{wf})$, wherein J denotes the productivity index of the well. When the bottom-hole flowing pressure is below bubble-point pressure, the IPR is given as:

$$q_o = J(P_r - P_b) + \frac{1}{2P_b}(P_b^2 - P_{wf}^2)$$

Cheng, in "Inflow Performance Relationships for Solution-Gas-Drive Slanted/Horizontal Wells," Paper SPE 20720 presented at the 1990 SPE Annual Technical Conference and Exhibition, New Orleans, La., September 23-26", incorporated herein by reference, presented IPR equations for slanted and horizontal wells. The IPR for all the slant angles considered by Cheng can be generally expressed as:

$$\frac{q_o}{q_{o,max}} = a0 - a1\left(\frac{P'_{wf}}{P_r}\right) - a2\left(\frac{P'_{wf}}{P_r}\right)^2$$

Wherein $q_{o,max}$ is the maximum oil flow rate through the well. The constants a0, a1 and a2 vary for different slant angles. The following assumptions were made by Cheng in his investigation: (1) the well is located in the center of a completely bounded reservoir of rectangular prism geometry, (2) the reservoir is homogeneous and isotropic with constant water saturation, (3) water saturation is immobile during depletion of the well. Therefore, only two phase flows (oil and gas) are considered in the reservoir, (4) the well is producing under a semi-steady state condition and (5) capillary pressure forces of reservoir fluids are neglected.

Further, the work conducted by Beggs "Production Optimization Using NODAL Analysis," OGCI, Tulsa, Okla., 1991, incorporated by reference herein, modified Vogel's IPR to be suitable for under-saturated oil reservoirs by using rate tests for two different cases. The rate test for the first case was performed when the bottom-hole flowing pressure is equal to or greater than the bubble-point pressure, while the rate test for case two was performed when the bottom-hole flowing pressure is less than the bubble-point pressure. Specifically, for Case I: $P_b<P_{wf}<P_r$, the following equation is stated for the flow rate $$q_o=J(P_r-P'_{wf}), \text{ when } P_{wf}>P_b$$

For Case II: $P_{wf}<P_b$, the flow rate is expressed as $$q_o = J(P_r - P_b) + \frac{JP_b}{1.8}\left[1 - 0.2\left(\frac{P'_{wf}}{P_b}\right) - 0.8\left(\frac{P'_{wf}}{P_b}\right)^2\right]$$

Also, when $P_{wf} < P_b < P_r$, the productivity index is expressed as $$J = \frac{q_o}{P_r - P_b + \frac{JP_b}{1.8}\left[1 - 0.2\left(\frac{P'_{wf}}{P_b}\right) - 0.8\left(\frac{P'_{wf}}{P_b}\right)^2\right]}$$

Wherein for all $P_{wf} < P_b$, the flow rate can be expressed as $$q_o = J(P_r - P_b) + \frac{JP_b}{1.8}\left[1 - 0.2\left(\frac{P'_{wf}}{P_b}\right) - 0.8\left(\frac{P'_{wf}}{P_b}\right)^2\right]$$

For $P_{wf} > P_b$ the flow rate is expressed as $q_o = J(P_r - P'_{wf})$. Further, to account for formation damage or stimulation, Beggs' IPR was modified to produce a flow rate as stated below:

$$q_o = J(P_r - P_b) + \frac{JP_b}{1.8}\left[1.8\left(1 - \left(\frac{P_{wf}}{P_b}\right)\right) - 0.8FE\left(1 - \left(\frac{P'_{wf}}{P_b}\right)\right)^2\right]$$

The above models characterize flow rate for vertical wells in under-saturated reservoirs. Specifically, the flow rate computations are determined in wells wherein the average reservoir pressure is below a bubble point pressure. Accordingly there is a requirement for a generalized model for determining oil well performances of under saturated and saturated reservoirs.

SUMMARY

The present disclosure describes a modified standardized model for determining flow performance in slanted and horizontal wells in saturated and unsaturated reservoirs and a computer-implemented method for estimating reservoir inflow performance.

In a further embodiment the model is integrated with a straight line IPR model to be suitable for oil wells of any orientation/slant angle within the entire azimuth 0° (vertical well) to 90° (horizontal well) in saturated and under-saturated reservoirs.

In another embodiment the coefficients of Cheng's model are standardized in order to account for vertical reservoirs and adhere to the physical concept of fluid mechanics. Specifically, the physical concept of fluid mechanics implies that there is no fluid flow from one point to another without a pressure difference between the two points. Thus, for a flow rate q, not to be equal to zero, the flowing bottom-hole pressure $P_{wf}$ must not be equal to the average reservoir pressure, $P_r$. The standardized coefficients are used to develop a general IPR model to estimate inflow performance of oil wells of any orientation/slant angle within the entire azimuth 0° (vertical well) to 90° (horizontal well) in saturated reservoirs.

In a further embodiment in order to account for formation damage or stimulation which is usually experienced in field studies, the IPR model includes a parameter that captures the effect of skin factor.

In a further embodiment the concept of Beggs is applied in order to develop a new model for under-saturated reservoirs by considering two case studies, having the flowing bottom-hole pressure below and above the bubble point pressure, respectively. The bottom-hole pressure is the pressure with which oil flows from the sand face to the surface through the tubing, whereas bubble point pressure is the pressure below which dissolved gas starts coming out of the oil thereby leading to a multi-phase flow.

For the case of flowing bottom-hole pressures being above the bubble-point pressure, the straight line IPR model is applied and for the case where the bottom-hole pressure is below the bubble-point pressure, the modified generalized IPR model is applied. The two IPR models are integrated to generate the new model to cover both saturated and under-statured regions of reservoirs. Further, the model described in the present disclosure is validated by comparing the model to an existing model described by Fetkovich, by using real field data.

In another embodiment the present disclosure provides a method of estimating inflow performance relationship (IPR) of a well, wherein the method includes: standardizing, by performing regression analysis of a first parameter and a second parameter with a slant angle of a well respectively; standardizing a third parameter based on the standardized first and second parameters; formulating a first IPR model based on the first, second and third parameter, the first IPR model being used to determine a flow rate of a well when the reservoir is saturated; modifying the formulated first IPR model to incorporate for skin factor of the reservoir; and determining the flow rate of the well by integrating a straight line IPR model with the first IPR model, when the reservoir is under saturated.

Another embodiment provides a non-transitory computer readable medium having stored thereon a program that when executed by a computer causes the computer to execute a method of estimating inflow performance relationship (IPR) of a well. The method includes: standardizing, by performing regression analysis of a first parameter and a second parameter with a slant angle of a well respectively; standardizing a third parameter based on the standardized first and second parameters; formulating a first IPR model based on the first, second and third parameter, the first IPR model being used to determine a flow rate of a well when the reservoir is saturated; modifying the formulated first IPR model to incorporate for skin factor of the reservoir; and determining the flow rate of the well by integrating a straight line IPR model with the first IPR model, when the reservoir is under saturated.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

The inflow performance rate for an oil well of a particular slant angle can be determined using NIPER's public ware simulator (Cheng, "Inflow Performance Relationships for Solution-Gas-Drive Slanted/Horizontal Wells," Paper SPE 20720 presented at the 1990 SPE Annual Technical Conference and Exhibition, New Orleans, La., September 23-26", incorporated herein by reference). The IPR model developed by Cheng considers only specific angles of well slant which include 0°, 15°, 30°, 45°, 60°, 75°, 85° and 90°. The coefficients in Cheng's model (except at the slant angle of 0° (i.e. vertical well)) do not obey the physical concept of fluid mechanics (fluid flow in porous media). Specifically, there can be no flow of oil/gas when a bottom-hole flowing pressure ($P_{wf}$) is equal to the average reservoir pressure ($P_r$). Therefore, the coefficients of the model (for instance, a0, a1 and a2) need to be standardized.

According to an embodiment of the present disclosure the coefficients of the Cheng's model are standardized (normalized) using a linear regression technique. Linear regression is an approach to model the relationship between a scalar dependent variable and one or more explanatory (independent) variables. Specifically, the coefficient parameters a0, a1 and a2 of Cheng are standardized by using linear regression.

Figure 1A:
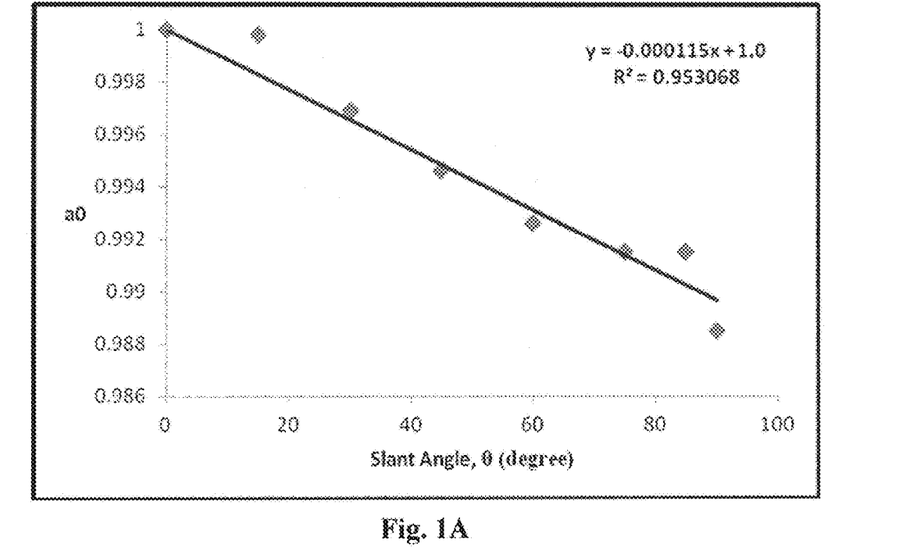
FIG. 1A and FIG. 1B depict a linear regression analysis of the first two coefficients of Cheng's IPR model.

FIG. 1A depicts the linear regression of the parameter a0. The regression analysis for a0 and slant angle, θ (degrees) gives:

$$a0 = -0.000115\theta + 1.0. \quad (1)$$

Figure 1B:
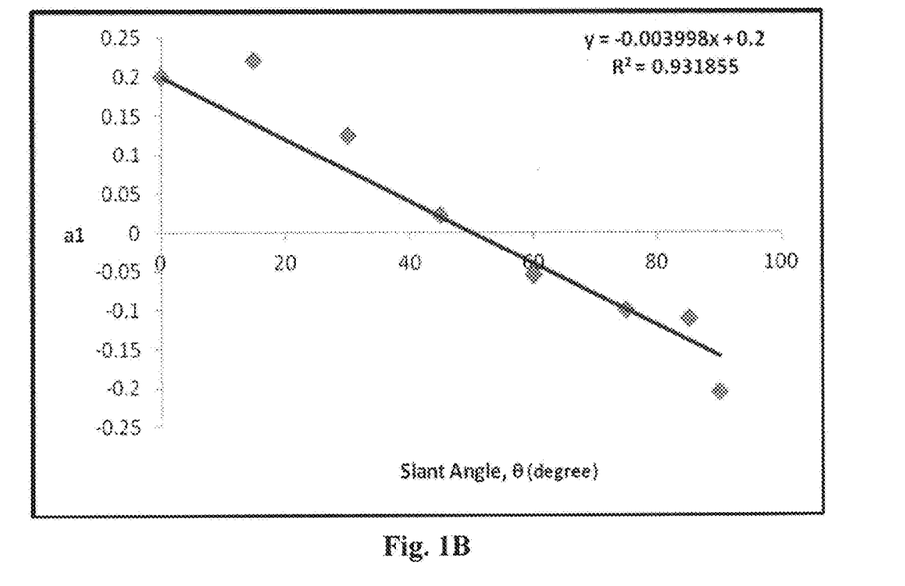
Figure 2A:
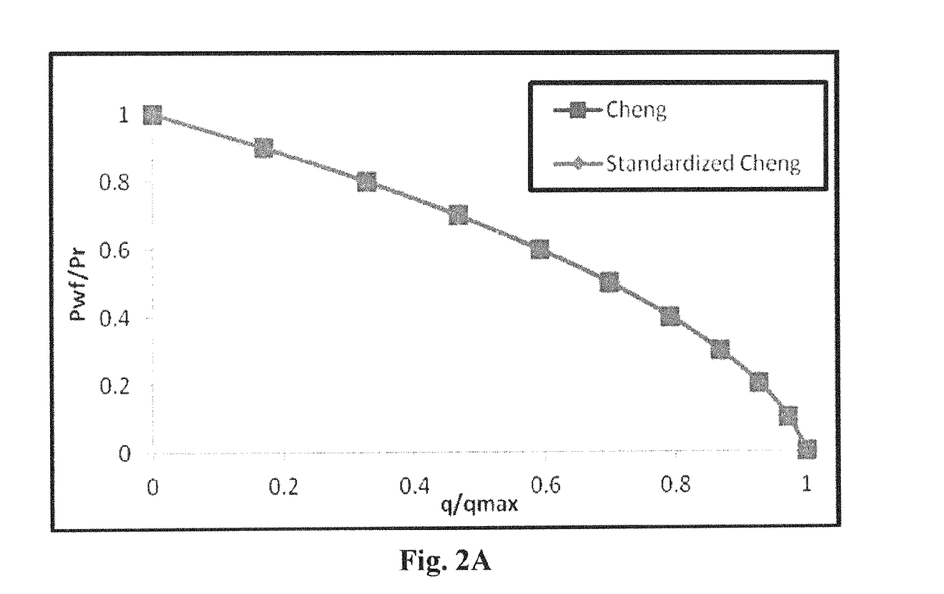
FIGS. 2A-2H depict the performance comparison of Cheng's IPR and the standardized Cheng's IPR for various slant angles of the oil wells.
Figure 2B:
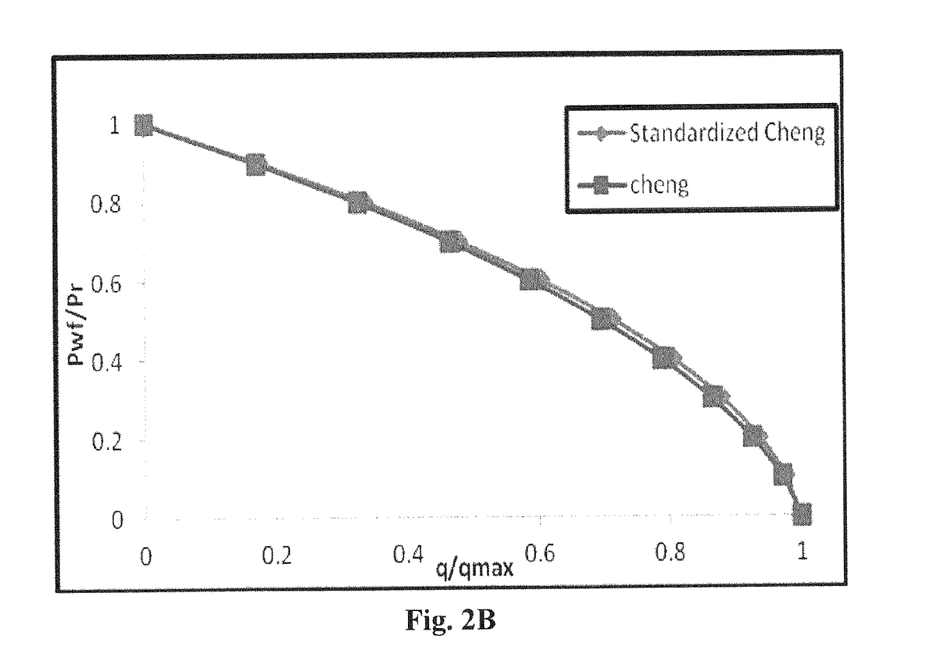
Figure 2C:
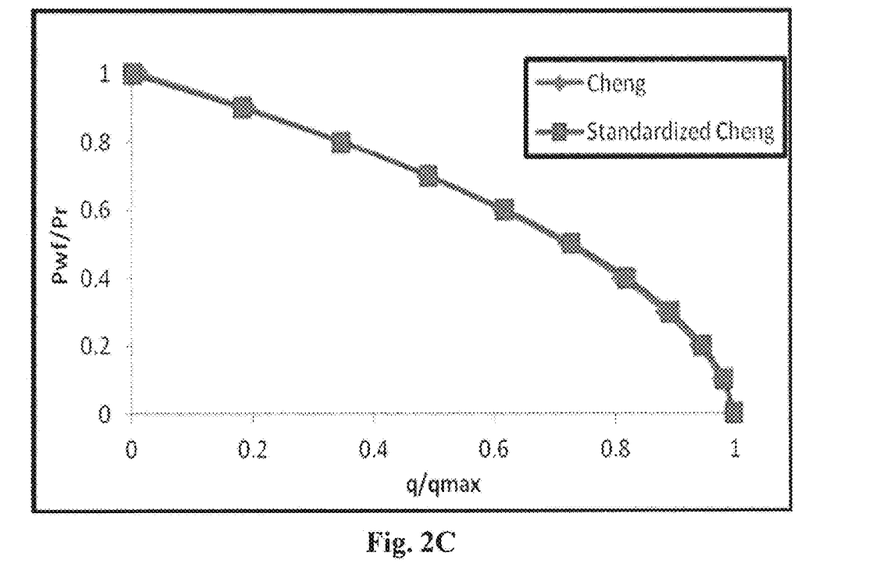
Figure 2D:
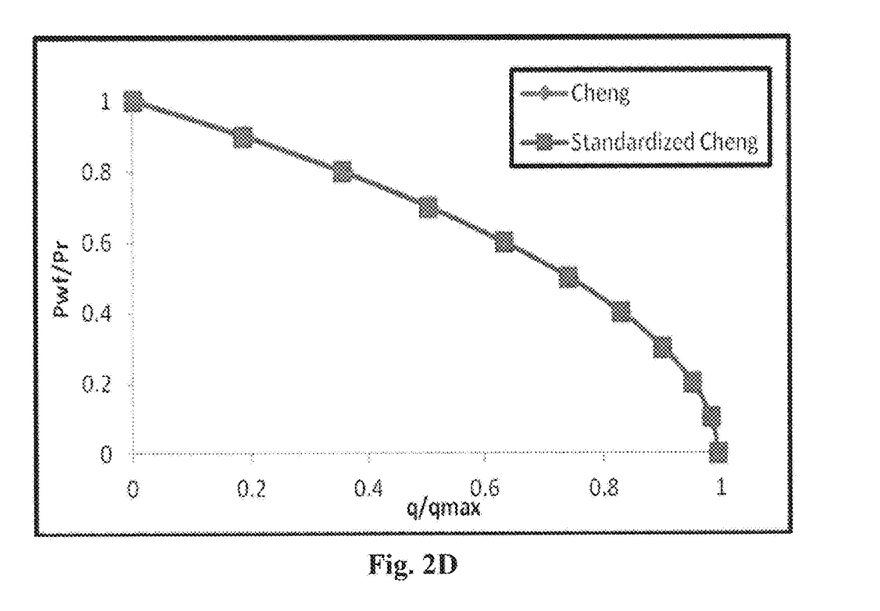
Figure 2E:
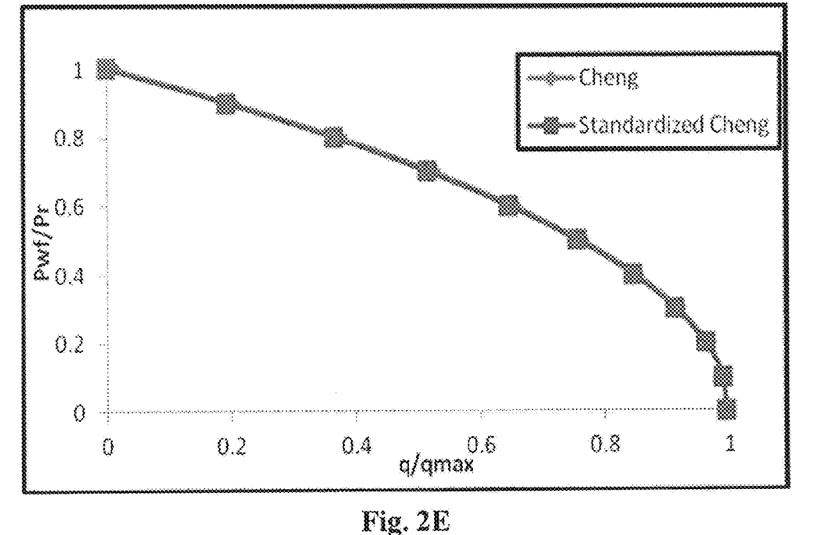
Figure 2F:
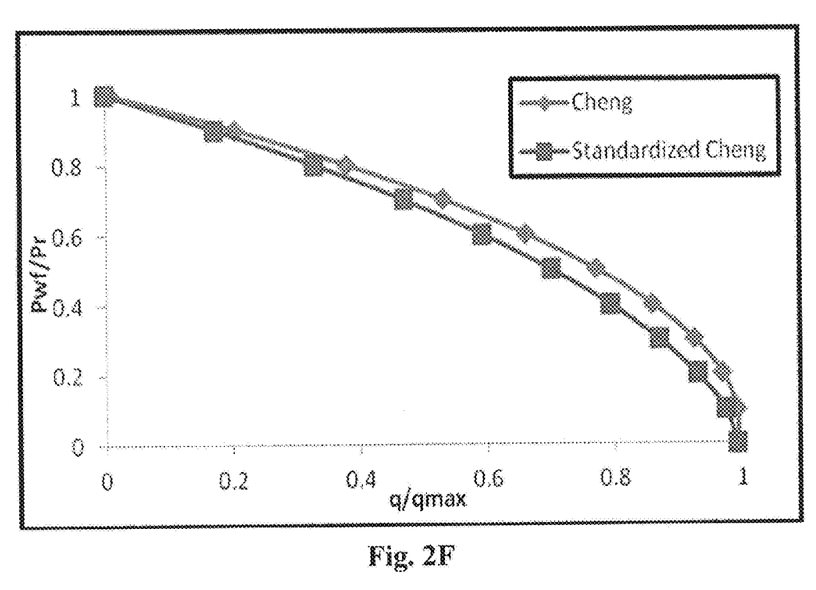
Figure 2G:
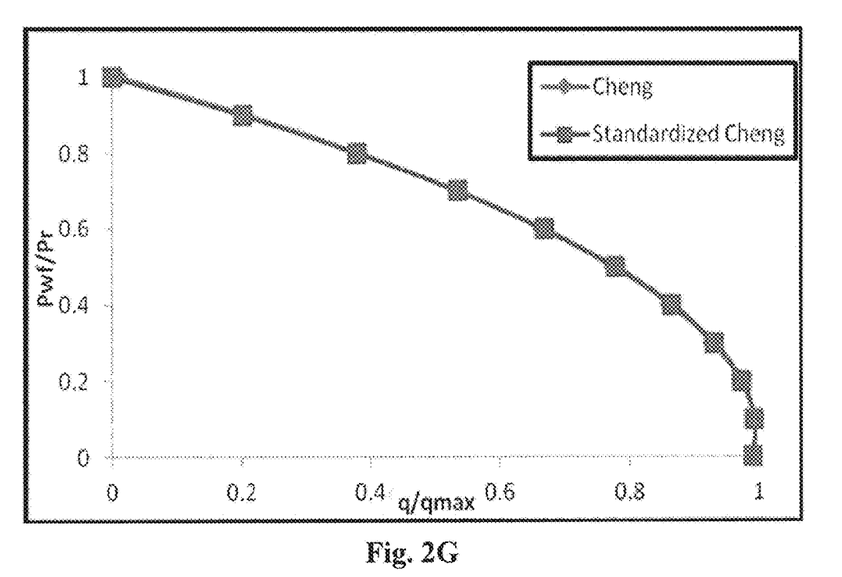
Figure 2H:
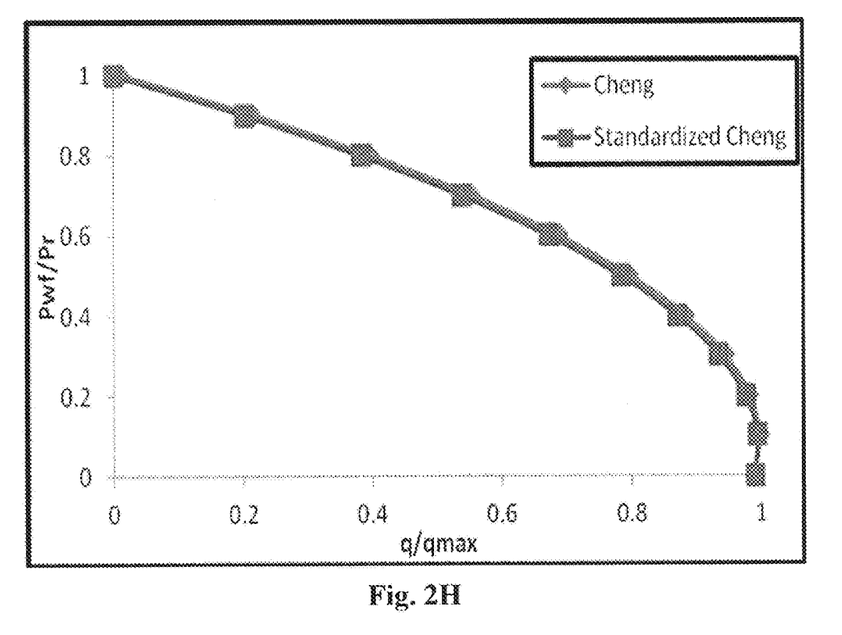

Similarly, the regression analysis of a1 is shown in FIG. 1B. The regression analysis for a1 and slant angle, θ (degrees) was performed in order to obey Vogel's IPR for vertical wells, i.e., θ=0°. Further, the physical concept of fluid mechanics (fluid flow in porous media) is also satisfied. The linear regression of a1 gives:

$$a1 = -0.003998\theta + 0.2. \quad (2)$$

The regression analysis for the coefficient a2 and slant angle is obtained by subtracting equations (2) from equation (1). This ensures that the coefficient a2 obeys Vogel's IPR and the physical concept of fluid mechanics (fluid flow in porous media). Specifically, the parameter a2 is determined as follows:

$$a2 = a0 - a1$$

$$a2 = 0.003883\theta + 0.8 \quad (3)$$

Accordingly, by standardizing the coefficients as shown above the generalized model is formulated as:

$$\frac{q_o}{q_{o,max}} = (1-\alpha) - (0.2-\beta)\left(\frac{P'_{wf}}{P_r}\right) - (0.8+\gamma)\left(\frac{P'_{wf}}{P_r}\right)^2 \quad (4)$$

wherein (5)

$$\alpha = 0.000015\theta, \quad$$

$$\beta = 0.003998\theta \quad (6)$$

$$\gamma = 0.003883\theta \quad (7)$$

$P'_{wf}$ is the bottom-hole flowing pressure with zero skin factor, $P_{wf}$ is the bottom-hole pressure with non-zero skin factor, $q_o$ is oil flow rate, $q_{o,max}$ is the maximum oil flow rate and $P_r$ is the average reservoir pressure.

According to another embodiment, in order to account for the effect of skin damage or stimulation, the generalized IPR can be modified as follows:

$$\text{Flow Efficiency, } FE = \frac{\text{Actual Productivity Index}}{\text{Ideal Productivity Index}} \quad (8)$$

$$= \frac{P_r - P'_{wf}}{P_r - P_{wf}}$$

Equation (8) can be rearranged to obtain $$P'_{wf} = P_r - FE(P_r - P_{wf}) \quad (9a)$$

$$\frac{P'_{wf}}{P_r} = 1 - FE + FE\left(\frac{P_{wf}}{P_r}\right) \quad (9b)$$

The equation for flow rate with non-zero skin factor can be obtained by substitution as follows:

$$\frac{q_o}{q_{o,max}} = aFE\left(1 - \frac{P_{wf}}{P_r}\right) - bFE^2\left(1 - \frac{P_{wf}}{P_r}\right)^2 \quad (10)$$

Wherein a=1.8+0.003768θ and b=0.8+0.003883θ. The skin factor refers to whether the reservoir is already stimulated or is damaged. If the skin factor is positive, the reservoir is damaged, and the well could be an excellent candidate for stimulation.

Accordingly, a new model suitable for oil wells of any orientation (slant angle) within the entire azimuth 0° (vertical well) to 90° (horizontal well) in under-saturated reservoirs and saturated reservoirs can be developed as follows:

For the case of under saturated oil reservoirs, the bottom-hole pressure $P_{wf}$ is equal to or above the bubble-point pressure $P_b$. Specifically, the condition ($P_b < P_{wf} < P_r$) is valid.

For this scenario the oil flow performance can be modeled with two regions: under-saturated region (where $P_{wf} > P_b$) using a straight line IPR: $q_o = J(P_r - P_{wf})$, wherein J is the productivity index of the well, $P_r$ is the average reservoir pressure and $P_{wf}$ is the bottom hole flowing pressure with zero skin factor, and a saturated region (where $P_{wf} < P_b$) using equation (4) above. The equations for the two regions are then integrated or combined as shown below to obtain an IPR model for under-saturated oil reservoirs For the saturated oil reservoirs the oil flow performance can be modeled with only one region: saturated region (where $P_{wf} < P_b$) using equation (4) above. The computations below show how the saturated region is integrated with the under saturated region to obtain IPR for under-saturated oil reservoirs. Equation (11) below is obtained from equation (4), which is the IPR model for saturated oil reservoirs by replacing Pr with $P_b$ since for saturated reservoirs, Pr less than $P_b$.

$$\frac{q_o}{q_{o,max}} = (1 - 0.000115\theta) - \quad (11)$$

$$(0.2 - 0.003998\theta)\left(\frac{P'_{wf}}{P_b}\right) - (0.8 + 0.003883\theta)\left(\frac{P'_{wf}}{P_b}\right)^2$$

Equation (11) can be rewritten as follows:

$$\frac{q_o}{q_{o,max}} = \left(1 - \left(\frac{P'_{wf}}{P_b}\right)\right)(1 - 0.000115\theta) + \left(0.8 + 0.003883\theta\left(\frac{P'_{wf}}{P_b}\right)\right) \quad (12)$$

$$\frac{J\Delta P}{q_{o,max}} = \left(1 - \left(\frac{P'_{wf}}{P_b}\right)\right)(1 - 0.000115\theta) + \left(0.8 + 0.003883\theta\left(\frac{P'_{wf}}{P_b}\right)\right) \quad (13)$$

wherein drawdown pressure, $\Delta P = P_r - P_{wf}$.

$$\frac{J}{q_{o,max}} = \left(\frac{1}{P_b}\right)\left((1 - 0.000115\theta) + (0.8 + 0.003883\theta)\left(\frac{P'_{wf}}{P_b}\right)\right) \quad (14)$$

By using Standings, "Inflow Performance Relationships for Damaged Wells Producing by Solution-Gas Drive," JPT, November 1970, pp. 1399-1400, incorporated herein by reference, zero drawdown productivity index, $$\frac{J}{q_{o,max}} = \left(\frac{1}{P_b}\right)(1.8 + 0.003768\theta) \quad (15)$$

$$q_{o,max} = \frac{JP_b}{(1.8 + 0.003768\theta)} \quad (16)$$

IPR model for saturated reservoirs (or saturated region of under-saturated reservoir) can be rewritten as:

$$q_o = q_{o,max}\left[(1 - \alpha) - (0.2 - \beta)\left(\frac{P'_{wf}}{P_b}\right) - (0.8 + \gamma)\left(\frac{P'_{wf}}{P_b}\right)^2\right]$$

IPR model (i.e. straight line IPR) for under saturated region is given as $$q_o = q_{ob} = J(P_r - P_b)$$

By adding the above two equations, we have:

$$q_o = q_{o,b} + q_{o,max}\left[(1 - \alpha) - (0.2 - \beta)\left(\frac{P'_{wf}}{P_b}\right) - (0.8 + \gamma)\left(\frac{P'_{wf}}{P_b}\right)^2\right] \quad (17)$$

Therefore, the IPR model for under saturated oil reservoirs is given as:

$$q_o = q_{ob} + \quad (18)$$
$$\frac{JP_b}{(1.8 + 0.003768\theta)}\left[(1 - \alpha) - (0.2 - \beta)\left(\frac{P'_{wf}}{P_b}\right) - (0.8 + \gamma)\left(\frac{P'_{wf}}{P_b}\right)^2\right]$$

Wherein $q_o$=oil flow rate, $$\frac{STB}{D}$$

or BOPD, STB is Stock Tank Barrel, psi is pound on square inch, D is day, and BOPD is barrels of oil per day.

$q_{o,max}$=maximum oil flow rate, $$\frac{STB}{D}$$

or BOPD and

J=productivity index, $$\frac{STB}{D}/psi$$

and qob is the oil rate at we bubble point pressure.

Thus, according to an embodiment, the IPR model for under saturated (and saturated) oil reservoirs is:

$$q_o = J(P_r - P_b) + \frac{JP_b}{a}\left[(1 - \alpha) - (0.2 - \beta)\left(\frac{P'_{wf}}{P_b}\right) - (0.8 + \gamma)\left(\frac{P'_{wf}}{P_b}\right)^2\right] \quad (19)$$

Equation (19) can be modified to incorporate for effect of formation damage or stimulation as:

$$q_o = J(P_r - P_b) + \frac{JP_b}{a}\left[a\left(1 - \frac{P_{wf}}{P_b}\right) - bFE\left(1 - \frac{P_{wf}}{P_b}\right)^2\right] \quad (20)$$

Equation (20) reduces to equation (19) when there is no formation damage or stimulation. Specifically, the skin factor is zero and the flow efficiency is one. This model can be integrated with the straight line IPR:

$$J = \frac{q_o}{P_r - P_{wf}}$$

to model the scenario when the bottom-hole pressure is greater than bubble point pressure.

As stated previously, Cheng's IPR flow model does not standardize the coefficients and the physical concept of fluid mechanics is obeyed only when the slant angle is $\theta = 0°$. The IPR coefficients of Cheng are represented in Table I.

TABLE 1

| Cheng's IPR coefficients for different slant angles | | | |
|---|---|---|---|
| Slant Angle, Degrees | a0 | a1 | a2 |
| 0 | 1.0000 | 0.2000 | 0.8000 |
| 15 | 0.9998 | 0.2210 | 0.7783 |
| 30 | 0.9969 | 0.1254 | 0.8582 |
| 45 | 0.9946 | 0.0221 | 0.9663 |
| 60 | 0.9926 | −0.0549 | 1.0395 |
| 75 | 0.9915 | −0.1002 | 1.0829 |
| 85 | 0.9915 | −0.1120 | 1.0942 |
| 90 | 0.9885 | −0.2055 | 1.1818 |

According to an embodiment, upon standardizing the coefficients of Cheng's by performing linear regression, the coefficients obtained are listed in Table II.

TABLE 2

Standardized Cheng's IPR coefficients for different slant angles

| Slant Angle, Degrees | a0 | a1 | a2 |
|---|---|---|---|
| 0 | 1.00000 | 0.20000 | 0.80000 |
| 15 | 0.99828 | 0.14003 | 0.85825 |
| 30 | 0.99655 | 0.08006 | 0.91649 |
| 45 | 0.99483 | 0.02009 | 0.97474 |
| 60 | 0.99310 | −0.03988 | 1.03298 |
| 75 | 0.99138 | −0.09985 | 1.09123 |
| 85 | 0.99023 | −0.13983 | 1.13006 |
| 90 | 0.98965 | −0.15982 | 1.14947 |

With these standardized coefficients, the physical concept of fluid mechanics (fluid flow in porous media) is obeyed at any well slant angle. FIGS. 2A-2H depict a comparison between Cheng's IPR and the standardized IPR for the well slant angles 0°, 15°, 30°, 45°, 60°, 75°, 85° and 90°, respectively. The graphs are plotted with a normalized flow ($q/q_{max}$) on the X-axis and a normalized bottom-hole pressure with respect to reservoir pressure ($P_{wf}/P_r$) on the Y-axis.

The model of the present disclosure is based on assumptions drawn from Cheng's investigation for the purpose of simplicity. Specifically, it is assumed that the well is located in the center of a completely bounded reservoir of rectangular prism geometry, the reservoir is homogeneous and isotropic with constant water saturation, water saturation is immobile during depletion of the well, the well is producing under a semi-steady state condition, and that the capillary pressure forces of reservoir fluids are neglected.

According to another embodiment, the IPR model of the present disclosure is validated by comparing its performance with that of Fetkovich's IPR model for the Middle East giant field horizontal oil well. The parameters for the oil well are listed in Table III.

TABLE III

Parameters of the oil well
Middle East Giant Field Horizontal Oil Well

| | |
|---|---|
| Horizontal Effective Well Length ($L_e$), ft | = 3343 |
| Assumed Drainage Width ($2Y_b$ or W), ft | = 8700 |
| Wellbore Radius ($r_w$), ft | = 0.26 |
| Effective Drainage Radius ($r_e$), ft | = 3170 |
| Net Pay Thickness (h), ft | = 180 |
| Reservoir Pressure ($P_e$), psi | = 3000 |
| Wellbore Flowing Pressure ($P_{wf}$), psi | = 2666 |
| Horizontal Permeability ($K_h$), md | = 784 |
| Vertical Permeability ($K_v$), md | = 2.5 |
| Oil Formation Volume Factor ($B_o$), bbl/STB | = 1.34 |
| Skin Factor (S) | = −3.5 |
| Oil Viscosity ($\mu_o$) | = 0.62 |
| Actual Productivity Index (J), STB/D/psi | = 207.8 |

For a productivity index J=207.8, the IPR model of the present disclosure is evaluated for the following cases:

For $P_{wf} > P_b$, $Q_o = J(P_r - P_{wf})$ and
For $P_{wf} \leq P_b$, $$Q_o = J(P_r - P_b) + \frac{JP_b}{a}\left[a\left(1 - \frac{P_{wf}}{P_b}\right) - bFE\left(1 - \frac{P_{wf}}{P_b}\right)^2\right]$$

Wherein a=1.8+0.003768θ. Since the oil well is horizontal θ=90°, thus a=2.13912.

The Fetkovich's model is evaluated as: For $P_{wf} > P_b$, $Q_o = J(P_r - P_{wf})$ and For $P_{wf} \leq P_b$, $$Q_o = J(P_r - P_b) + \frac{1}{2P_b}(P_b^2 - P_{wf}^2).$$

Figure 3:
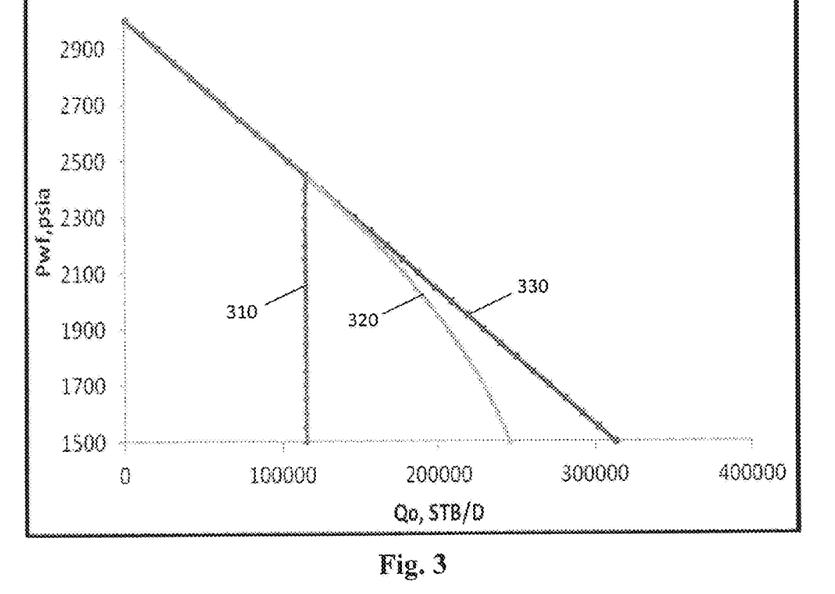
FIG. 3 is graph depicting a comparison of the model of the present disclosure and Fetkovich's IPR model

FIG. 3 is a graph depicting the performance of the model of the present disclosure (curve 320) compared to the performance of the Fetkovich's model (curve 310). In FIG. 3, the flow rate is plotted on the X-axis while the bottom-hole pressure is plotted on the Y-axis. The curve 330 represents a straight line IPR curve.

It can be observed from the graph in FIG. 3, that the flow rate is the same at pressures above bubble point pressure for both Fetkovich's model and the model of the present disclosure. However, at pressures lower than the bubble-point pressure, the present model is more accurate than Fetkovich's model. Specifically, when the bottom hole pressure is below the bubble point pressure, the production rate achieved by the model of the present disclosure is much higher than the rate achieved by the Fetkovich's model. At pressures just below the bubble-point pressure, there is a sharp deviation of the Fetkovich's IPR curve (310) from the straight IPR line (330), while the performance curve (320) of the present model shows gradual deviation. The gradual deviation is more reasonable as the flow rate cannot change abruptly just below the bubble-point pressure. Thus, the production rates achieved by the present model closely mimics the actual/real production rates achieved.

Thus, the model of the present disclosure can be used to estimate the inflow performance of oil wells of any orientation/slant angle within the azimuth 0° (vertical well) to 90° (horizontal well) in saturated and under-saturated reservoirs. The model incorporates and integrates the saturated region (below bubble-point pressure) and under-saturated region (above bubble-point pressure) of under-saturated reservoirs to predict oil well performance. The model is simple and quick to use and gives a more accurate estimate than existing Fetkovich IPR model.

Figure 4:
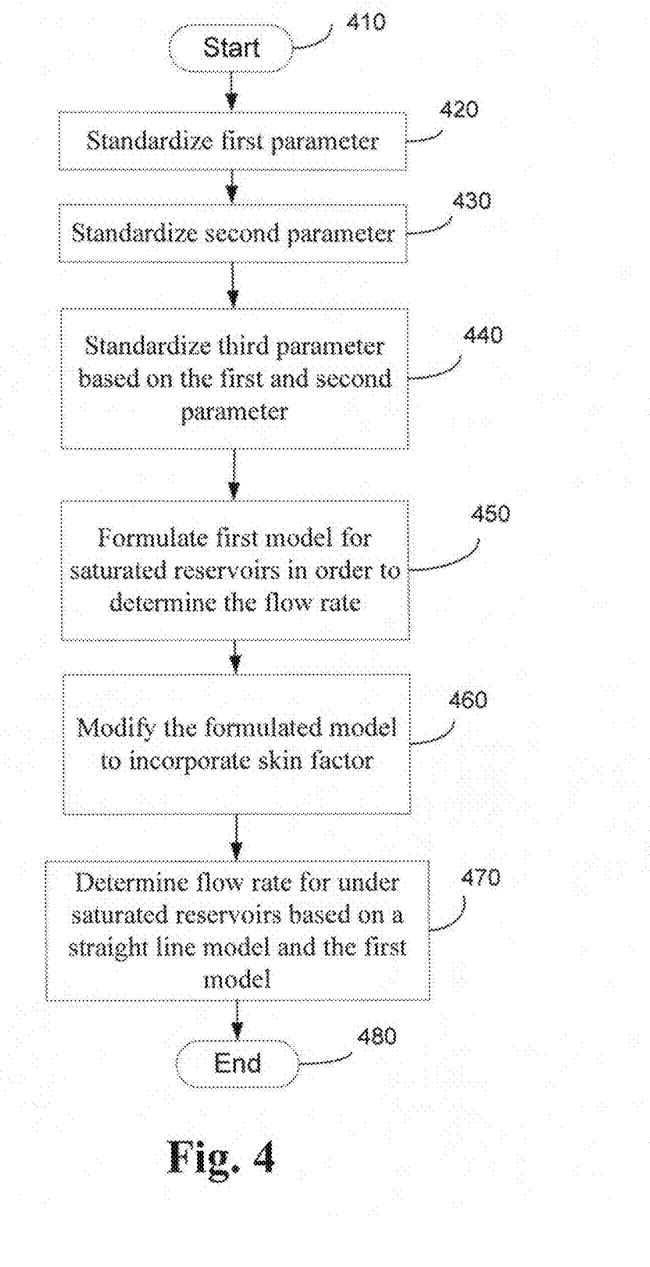
FIG. 4 is a flowchart depicting steps performed to determine the performance of saturated and under saturated reservoirs according to an embodiment.

FIG. 4 is a flowchart depicting steps performed to determine the performance of saturated and under saturated reservoirs according to an embodiment.

The process starts in step S410 and proceeds to step S420. In step S420, a first parameter of the Cheng's IPR model is standardized by performing linear regression. Specifically, the relationship between the first parameter and the slant angle of the well is determined. Linear regression of the first parameter and the slant angle results in the following relationship: a0=−0.000115θ+1.0, wherein a0 is the first parameter and θ is the slant angle of the well.

In step S430, a second parameter of the Cheng's IPR model is standardized by performing linear regression. Linear regression of the first parameter and the slant angle results in the following relationship: a1=−0.003998θ+0.2, wherein a1 is the second parameter and θ is the slant angle of the well.

In step S440, the third parameter of Cheng's IPR model is standardized by combining the equations obtained in step S420 and S430. The third parameter is standardized as a2=0.003883θ+0.8.

In step S450, a model is formulated to determine the performance of a saturated reservoir. Specifically, the model is formulated based on the determined standardized coefficients of steps S420-S440. The model is formulated as shown in equation (19). The model is based on the standardized coefficients, productivity index, average reservoir pressure, bottom-hole flowing pressure and bubble point pressure. With the formulated model the flow rate of the oil well can be easily determined.

In step S460, the formulated model in step S450 is modified to incorporate skin factor in order to account for formation damages. The modified model is formulated as shown in equation (20).

In step S470, for the case of under saturated reservoir, the flow rate of the reservoir is determined by using a straight line IPR equation: $q_o=J(P_r-P_{wf})$. After determining the respective flow rates for the saturated and under saturated reservoir regions, the process terminates in step S480.

In the above embodiments, the integration is performed for under-saturated reservoirs. Note that, under-saturated reservoirs are modeled with two regions: under-saturated and saturated regions. Therefore, they require the integration of the straight line IPR of the under saturated region with the IPR of the saturated region. However, saturated reservoirs are modeled with only one region (i.e., saturated region) and do not require any form of IPR integration.

Figure 5:
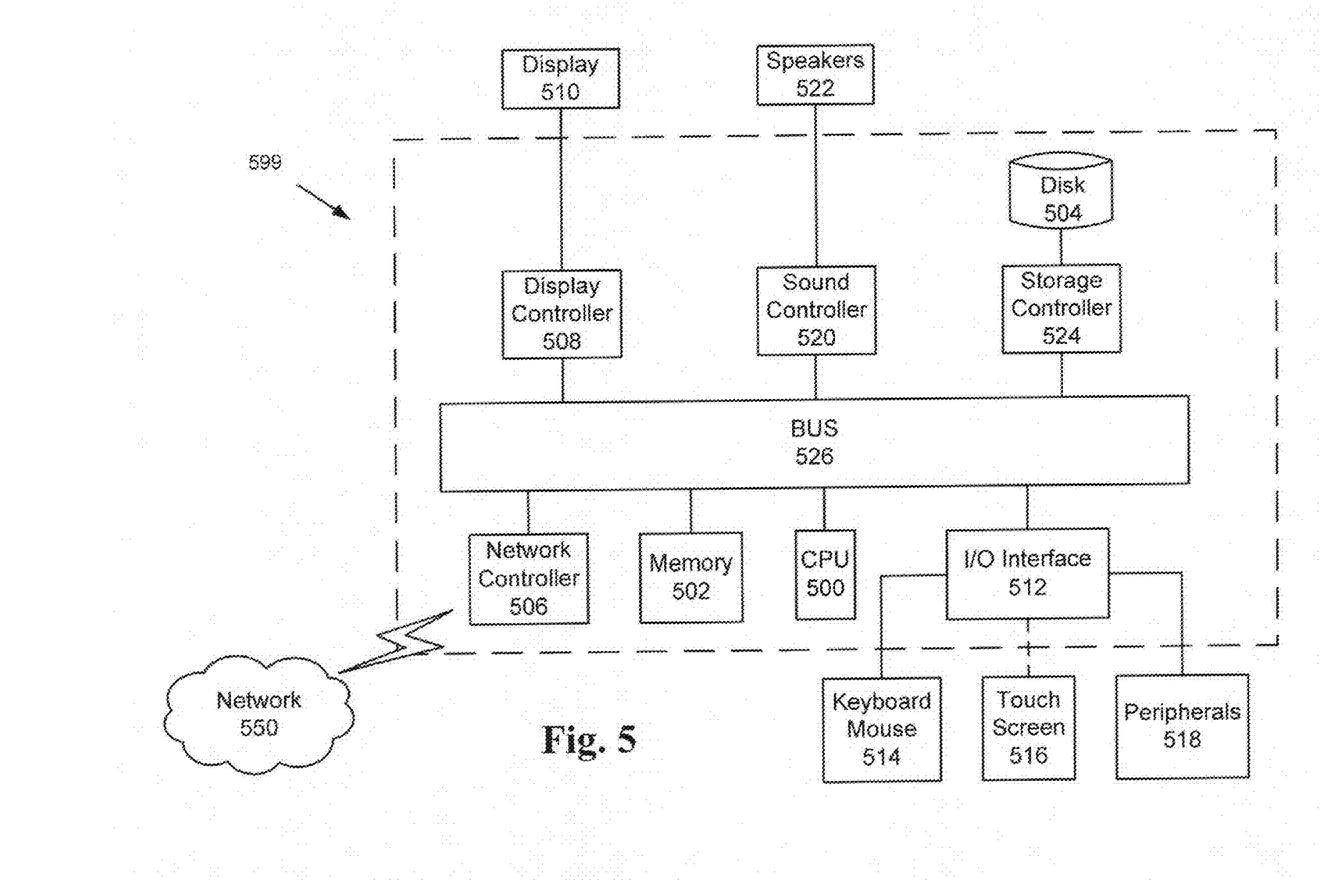
FIG. 5 illustrates a block diagram of a computing device according to an embodiment.

FIG. 5 illustrates a block diagram of a computing device according to an embodiment. In FIG. 5, the computer 599 includes a CPU 500 which performs the processes described above. The process data and instructions may be stored in memory 502. These processes and instructions may also be stored on a storage medium disk 504 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the system communicates, such as a server or computer.

Further, the claimed advancements may be provided as a utility application, background daemon, or component of an operating system, or combination thereof, executing in conjunction with CPU 500 and an operating system such as Microsoft Windows 7, UNIX, Solaris, LINUX, Apple MAC-OS and other systems known to those skilled in the art.

CPU 500 may be a Xenon or Core processor from Intel of America or an Opteron processor from AMD of America, or may be other processor types that would be recognized by one of ordinary skill in the art. Alternatively, the CPU 500 may be implemented on an FPGA, ASIC, PLD or using discrete logic circuits, as one of ordinary skill in the art would recognize. Further, CPU 500 may be implemented as multiple processors cooperatively working in parallel to perform the instructions of the inventive processes described above.

The computer 599 in FIG. 5 also includes a network controller 506, such as an Intel Ethernet PRO network interface card from Intel Corporation of America, for interfacing with network 550. As can be appreciated, the network 550 can be a public network, such as the Internet, or a private network such as an LAN or WAN network, or any combination thereof and can also include PSTN or ISDN sub-networks. The network 550 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer 599 further includes a display controller 508, such as a NVIDIA GeForce GTX or Quadro graphics adaptor from NVIDIA Corporation of America for interfacing with display 510, such as a Hewlett Packard HPL2445w LCD monitor. A general purpose I/O interface 512 interfaces with a keyboard and/or mouse 514 as well as a touch screen panel 516 on or separate from display 510. General purpose I/O interface also connects to a variety of peripherals 518 including printers and scanners, such as an OfficeJet or DeskJet from Hewlett Packard.

A sound controller 520 may also be provided in the computer 599, such as Sound Blaster X-Fi Titanium from Creative, to interface with speakers/microphone 522 thereby providing sounds and/or music. The speakers/microphone 522 can also be used to accept dictated words as commands for controlling the robot-guided medical procedure system or for providing location and/or property information with respect to the target property.

The general purpose storage controller 524 connects the storage medium disk 304 with communication bus 526, which may be an ISA, EISA, VESA, PCI, or similar, for interconnecting all of the components of the robot-guided medical procedure system. A description of the general features and functionality of the display 510, keyboard and/or mouse 514, as well as the display controller 508, storage controller 524, network controller 506, sound controller 520, and general purpose I/O interface 512 is omitted herein for brevity as these features are known.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

The invention claimed is:

1. A method of estimating an inflow performance relationship (IPR) of oil into an oil well located in a reservoir in an oil-producing formation, the method comprising:
   standardizing, by performing regression analysis of a first parameter (a0) and a second parameter (a1) with a slant angle of the oil well respectively on a computer processor, wherein the first parameter (a0) is standardized with respect to the slant angle of the well ($\theta$) as a0=$-0.000115\theta+1.0$, and the second parameter (a1) is standardized with respect to the slant angle as a1=$-0.003998\theta+0.2$;
   standardizing a third parameter (a2) based on the standardized first and second parameters on the computer processor;
   formulating a first IPR model based on the first, second and third parameter on the computer processor, wherein the first IPR model provides an estimate of a flow rate of the oil well when the reservoir is saturated;
   modifying the formulated first IPR model to incorporate a skin factor of the reservoir;
   determining a flow rate of the oil well when the reservoir is under saturated by integrating a second IPR model with the first IPR model; and
   increasing or decreasing a production rate of the oil well based on the flow rate of the first IPR model and the flow rate of the second IPR model.

2. The method of claim 1, wherein the slant angle of the oil well is within a range of 0° to 90°.

3. The method of claim 1, wherein the third parameter (a2) is standardized by subtracting the second parameter from the first parameter to obtain a2=$0.003883\theta+0.8$.

4. The method of claim 1, wherein the reservoir is saturated when a bottom-hole pressure is less than a bubble point pressure and the reservoir is under-saturated when the bottom hole pressure is greater than or equal to the bubble point pressure.

5. The method of claim 1, wherein the first IPR model is formulated for the saturated reservoir as:

$$q_o = q_{o,max}\left[(1-\alpha) - (0.2-\beta)\left(\frac{P'_{wf}}{P_b}\right) - (0.8+\gamma)\left(\frac{P'_{wf}}{P_b}\right)^2\right],$$

wherein, $q_o$ is an oil flow rate, $q_{o,max}$ is a maximum oil flow rate, $P'_{wf}$ is a bottom-hole flowing pressure with zero skin factor, $P_b$ is a bubble point pressure, and $(1-\alpha)$, $(0.2-\beta)$ and $(0.8+\gamma)$ are the standardized first, second and third parameters, respectively.

6. The method of claim 1, wherein the modifying step modifies the first IPR model by including a flow efficiency parameter to incorporate the skin factor to obtain a modified first IPR model.

7. The method of claim 6, wherein the modified first IPR model for the saturated reservoir is:

$$\frac{q_o}{q_{o,max}} = aFE\left(1 - \frac{P_{wf}}{P_r}\right) - bFE^2\left(1 - \frac{P_{wf}}{P_r}\right)^2,$$

wherein, $q_o$ is an oil flow rate, $q_{o,max}$ id a maximum oil flow rate, FE is flow efficiency, $P_r$ is average reservoir pressure, $P_{wf}$ is bottom-hole pressure with a non-zero skin factor, and a and b are parameters based on the slant angle of the well.

8. The method of claim 1, wherein the second IPR model is a straight line model formulated as:

$$q_{ob} = J(P_r - P_b),$$

wherein, J is productivity index of the under-saturated well, $q_{ob}$ is flow rate at a bubble point pressure, $P_b$ is the bubble point pressure and $P_r$ is average reservoir pressure.

9. The method of claim 1, wherein the flow rate, $q_o$, for the under-saturated well is determined as:

$$q_o = q_{ob} + \frac{JP_b}{(1.8 + 003768\theta)}\left[(1-\alpha) - (0.2-\beta)\left(\frac{P'_{wf}}{P_b}\right) - (0.8+\gamma)\left(\frac{P'_{wf}}{P_b}\right)^2\right],$$

wherein, $q_{ob}$ is flow rate at a bubble point pressure, $P_b$ is the bubble point pressure, $P'_{wf}$ is a bottom-hole flowing pressure with zero skin factor, J is productivity index of the under-saturated well, $\theta$ is the slant angle of the oil well, and $(1-\alpha)$, $(0.2-\beta)$ and $(0.8+\gamma)$ are the standardized first, second and third parameters, respectively.

10. A non-transitory computer readable medium having stored thereon a program that when executed by a computer causes the computer to execute a method for estimating an inflow performance relationship (IPR) of oil into an oil well located in a reservoir in an oil-producing formation, the method comprising:

standardizing, by performing regression analysis of a first parameter (a0) and a second parameter (a1) with a slant angle of the oil well respectively on a computer processor, wherein the first parameter (a0) is standardized with respect to the slant angle of the well ($\theta$) as a0=−0.000115θ+1.0, and the second parameter (a1) is standardized with respect to the slant angle as a1=−0.003998θ+0.2;

standardizing a third parameter (a2) based on the standardized first and second parameters on the computer processor;

formulating a first IPR model based on the first, second and third parameter on the computer processor, wherein the first IPR model provides an estimate of a flow rate of the oil well when the reservoir is saturated;

modifying the formulated first IPR model to incorporate a skin factor of the reservoir;

determining a flow rate of the oil well when the reservoir is under saturated by integrating a straight line IPR model with the first IPR model; and increasing or decreasing a production rate of the oil well based on the flow rate of the first IPR model and the flow rate of the second IPR model.

11. The non-transitory computer readable medium of claim 10, wherein the slant angle of the oil well is within a range of 0° to 90°.

12. The non-transitory computer readable medium of claim 10, wherein the third parameter (a2) is standardized by subtracting the second parameter from the first parameter to obtain a2=0.003883θ+0.8.

13. The non-transitory computer readable medium of claim 10, wherein the first IPR model is formulated for the saturated reservoir as:

$$q_o = q_{o,max}\left[(1-\alpha) - (0.2-\beta)\left(\frac{P'_{wf}}{P_b}\right) - (0.8+\gamma)\left(\frac{P'_{wf}}{P_b}\right)^2\right],$$

wherein, $q_o$ is an oil flow rate, $q_{o,max}$ is a maximum oil flow rate, $P'_{wf}$ is a bottom-hole flowing pressure with zero skin factor, $P_b$ is a bubble point pressure, and $(1-\alpha)$, $(0.2-\beta)$ and $(0.8+\gamma)$ are the standardized first, second and third parameters, respectively.

14. The non-transitory computer readable medium of claim 10, wherein the modifying step modifies the first IPR model by including a flow efficiency parameter to incorporate the skin factor to obtain a modified first IPR model.

15. The non-transitory computer readable medium of claim 14, wherein the modified first IPR model for the saturated reservoir is:

$$\frac{q_o}{q_{o,max}} = aFE\left(1 - \frac{P_{wf}}{P_r}\right) - bFE^2\left(1 - \frac{P_{wf}}{P_r}\right)^2,$$

wherein, $q_o$ is an oil flow rate, $q_{o,max}$ is a maximum oil flow rate, FE is flow efficiency, $P_r$ is average reservoir pressure, $P_{wf}$ is bottom-hole pressure with a non-zero skin factor, and a and b are parameters based on the slant angle of the oil well.

16. The non-transitory computer readable medium of claim 10, wherein the second IPR model is a straight line model formulated as:

$$q_{ob} = J(P_r - P_b),$$

wherein, J is productivity index of the under-saturated well, $q_{ob}$ is flow rate at a bubble point pressure, $P_b$ is the bubble point pressure and $P_r$ is average reservoir pressure.

17. The non-transitory computer readable medium of claim 10, wherein the flow rate, $q_o$, for the under-saturated well is determined as:

$$q_o = q_{ob} + \frac{JP_b}{(1.8 + 0.003768\theta)}\left[(1-\alpha) - (0.2-\beta)\left(\frac{P'_{wf}}{P_b}\right) - (0.8+\gamma)\left(\frac{P'_{wf}}{P_b}\right)^2\right],$$

wherein, $q_{ob}$ is flow rate at a bubble point pressure, $P_b$ is the bubble point pressure, $P'_{wf}$ is a bottom-hole flowing pressure with zero skin factor, J is productivity index of the under-saturated well, $\theta$ is the slant angle of the oil well, and $(1-\alpha)$, $(0.2-\beta)$ and $(0.8+\gamma)$ are the standardized first, second and third parameters, respectively.

18. The non-transitory computer readable medium of claim 10, wherein the reservoir is saturated when a bottom-hole pressure is less than a bubble point pressure and the reservoir is under-saturated when the bottom hole pressure is greater than or equal to the bubble point pressure.

* * * * *